United States Patent [19]

Kamon

[11] Patent Number: 5,406,373
[45] Date of Patent: Apr. 11, 1995

[54] ALIGNMENT MARK AND ALIGNING METHOD USING THE SAME
[75] Inventor: Kazuya Kamon, Itami, Japan
[73] Assignee: Mitsubishi Denki Kabushiki Kaisha, Tokyo, Japan
[21] Appl. No.: 977,072
[22] Filed: Nov. 16, 1992
[30] Foreign Application Priority Data
  Jan. 28, 1992 [JP] Japan .................................. 4-012886
[51] Int. Cl.⁶ ............................................. G01B 11/00
[52] U.S. Cl. .................................................... 356/401
[58] Field of Search ................................ 356/399–401, 356/375; 437/924

[56] References Cited
U.S. PATENT DOCUMENTS
4,632,557 12/1986 Thompson ............................ 356/401

FOREIGN PATENT DOCUMENTS
0148819 7/1986 Japan ...................................... 437/924
40505511 3/1993 Japan ...................................... 437/924

Primary Examiner—Richard A. Rosenberger
Assistant Examiner—K. P. Hantis
Attorney, Agent, or Firm—Leydig, Voit & Mayer

[57] ABSTRACT

An alignment mark on a substrate for aligning the substrate includes a plurality of mark portions having different levels relative to the surface of the substrate. A method of aligning a substrate when a pattern on a mask is to be transferred onto the substrate includes forming an alignment mark on a surface of the substrate, the alignment mark including a plurality of mark portions having different levels relative to the surface of the substrate, illuminating the surface of the substrate with light, detecting an apparent position of each of the mark portions from light reflected from the surface of the substrate, calculating the position of a reference point having zero depth from the difference in the levels of the mark portions and the detected apparent position of each of the mark portions, and aligning the substrate in response to the calculated position of the reference point.

7 Claims, 6 Drawing Sheets

5,406,373

ALIGNMENT MARK AND ALIGNING METHOD USING THE SAME

BACKGROUND OF THE INVENTION

1. Field of the Invention

The present invention relates to an alignment mark used in an LSI manufacturing process, and an aligning method using the alignment mark.

2. Description of the Related Art

As show in FIGS. 7 and 8, a conventional alignment mark consists of a plurality of mark portions 1 on the surface of a substrate 2. The mark portions 1 are recessed portions having the same depth. A laser beam illuminates the substrate 2 perpendicular to the substrate 2, and is scanned along the surface of the substrate 2. When a laser beam illuminates an area 2 including the alignment mark, as shown in FIG. 8, light is diffracted due to the presence of the alignment mark, decreasing the intensity of light reflected by the surface of the substrate 2 perpendicular thereto. It is thus possible to detect the alignment mark by monitoring the intensity of light reflected by the substrate 2. Alignment of the substrate 2 is performed on this basis.

However, in the LSI manufacturing process, various films, such as a metal film 4 shown in FIG. 9, are formed on the surface of the substrate 2 for forming circuits. Since such a metal film 4 is also deposited within each of the mark portions 1 of the alignment mark, the apparent shape of the alignment mark is gradually deformed as the formation of the film on the surface of the substrate 2 proceeds. Particularly, when the metal is deposited obliquely with respect to the alignment mark, as shown in FIG. 9, the amount of metal deposited within each of the mark portions 1 is non-uniform. Consequently, a center $O_2$ of the alignment mark which appears on the surface of the metal film 4 deviates from a true center $O_1$ of the alignment mark on the surface of the substrate 2, and the alignment accuracy deteriorates.

SUMMARY OF THE INVENTION

Accordingly, an object of the present invention is to provide an alignment mark which assures a highly accurate alignment even when an apparent positional deviation of the alignment mark occurs due to the formation of a film on a substrate.

Another object of the present invention is to provide an aligning method which assures a highly accurate alignment by the use of such an alignment mark.

In order to achieve the above objects, according to one aspect of the present invention, there is provided an alignment mark on a substrate for aligning the substrate, which comprises a plurality of mark portions on a surface of the substrate and having different depths from the surface of the substrate.

According to another aspect of the present invention, there is provided an alignment method for aligning a substrate when a pattern on a mark is to be transferred onto the substrate, which comprises the steps of forming an alignment mark on a surface of the substrate, said alignment mark including a plurality of mark portions having different depths from the surface of the substrate, illuminating the surface of the substrate, detecting an apparent position of each of the mark portions from a light reflected from the surface of the substrate, calculating the position of a reference point having zero level from the differences in the levels of the plurality of mark portions and the detected apparent positions of each of the mark portions, and aligning the substrate on the basis of the calculated position of the reference point.

DETAILED DESCRIPTION OF THE PREFERRED EMBODIMENTS

Figure 1:
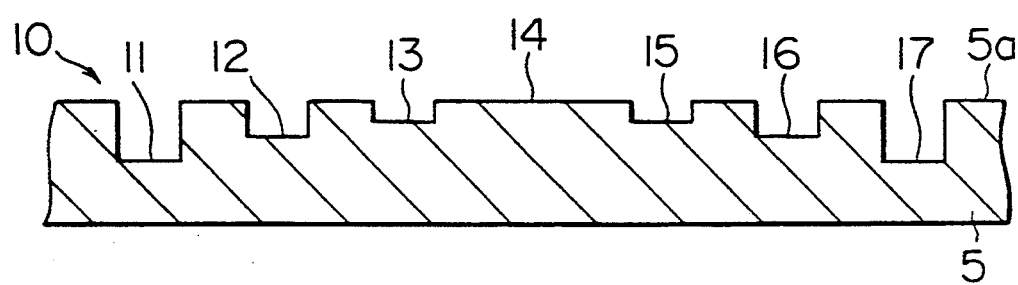
FIG. 1 is a cross-sectional view of a first embodiment of an alignment mark according to the present invention.
Figure 2:
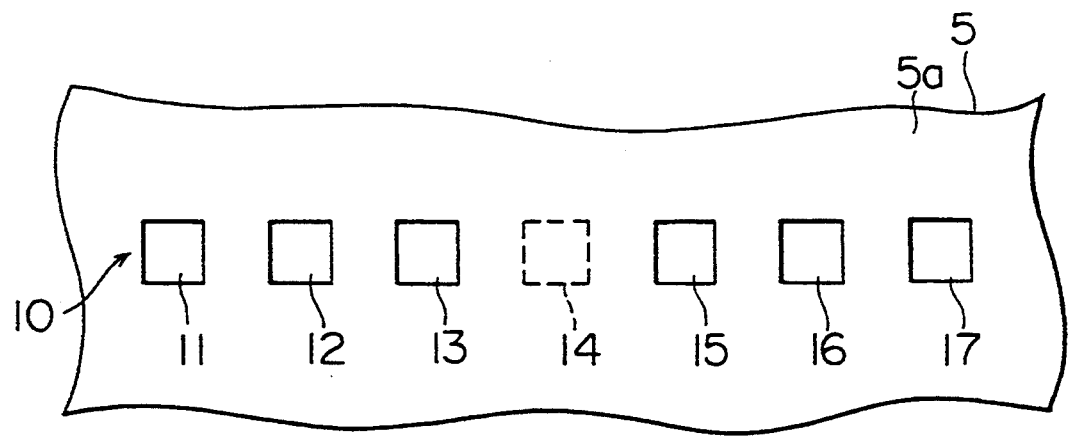
FIG. 2 is a plan view of the alignment mark of FIG. 1.

FIGS. 1 and 2 are respectively cross-sectional and plan views of an alignment mark 10 showing a first embodiment of the present invention. The alignment mark 10 has first through seventh mark portions 11 through 17 in a substrate 5 at a predetermined pitch. As shown in FIG. 1, the first through third mark portions 11 through 13 are recesses having different levels, i.e., depths, relative to a surface 5a of the substrate 5. The fourth mark portion 14 located at the center of the alignment mark 10 has the same level as the surface 5a of the substrate 5, i.e., zero depth, and cannot thus be externally discriminated from the surface 5a. The fifth, sixth and seventh mark portions 15, 16 and 17 are respectively recesses having the same levels as the third, second and first mark portions 13, 12 and 11.

Figure 3:
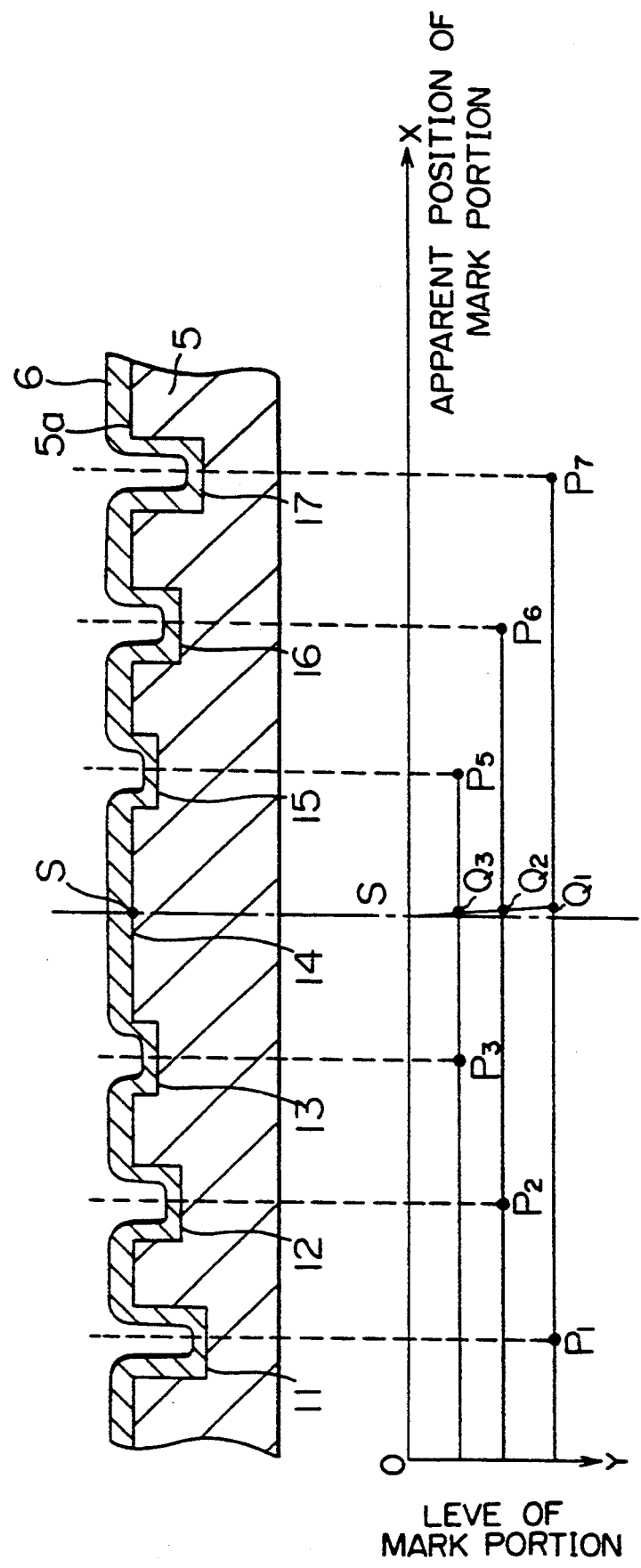
FIG. 3 illustrates an aligning method which employs the alignment mark of FIG. 1.
Figure 9:
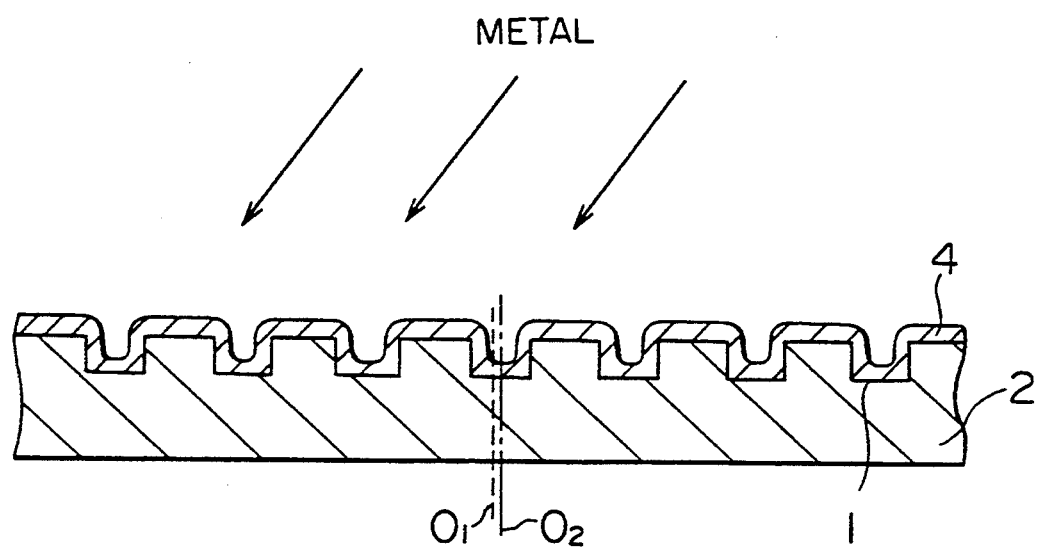
FIG. 9 illustrates the problem which arises from the alignment mark of FIG. 7.

When an LSI circuit is to be manufactured using the substrate 5 with such an alignment mark 10 thereon, first, a film, such as a metal film 6, is deposited on the surface 5a of the substrate for forming circuits, as shown in FIG. 3. At that time, if the metal is not deposited perpendicular to but obliquely to the surface 5a of the substrate 5, as in the case shown in FIG. 9, non-uniform deposition of the metal within each of the mark portions occurs. This causes the apparent position of the mark portion with the metal film 6 coated thereon to deviate from the true position of that mark portion on the substrate 5. This positional deviation corresponds to the level, i.e., the depth, of the mark portion. The deeper the mark portion, the larger the deviation of position. As shown in FIG. 3, in the alignment mark 10, the positional deviation in the first and seventh mark portions 11 and 17 is the maximum, and no positional deviation occurs in the fourth mark portion 14 having zero depth.

Figure 4:
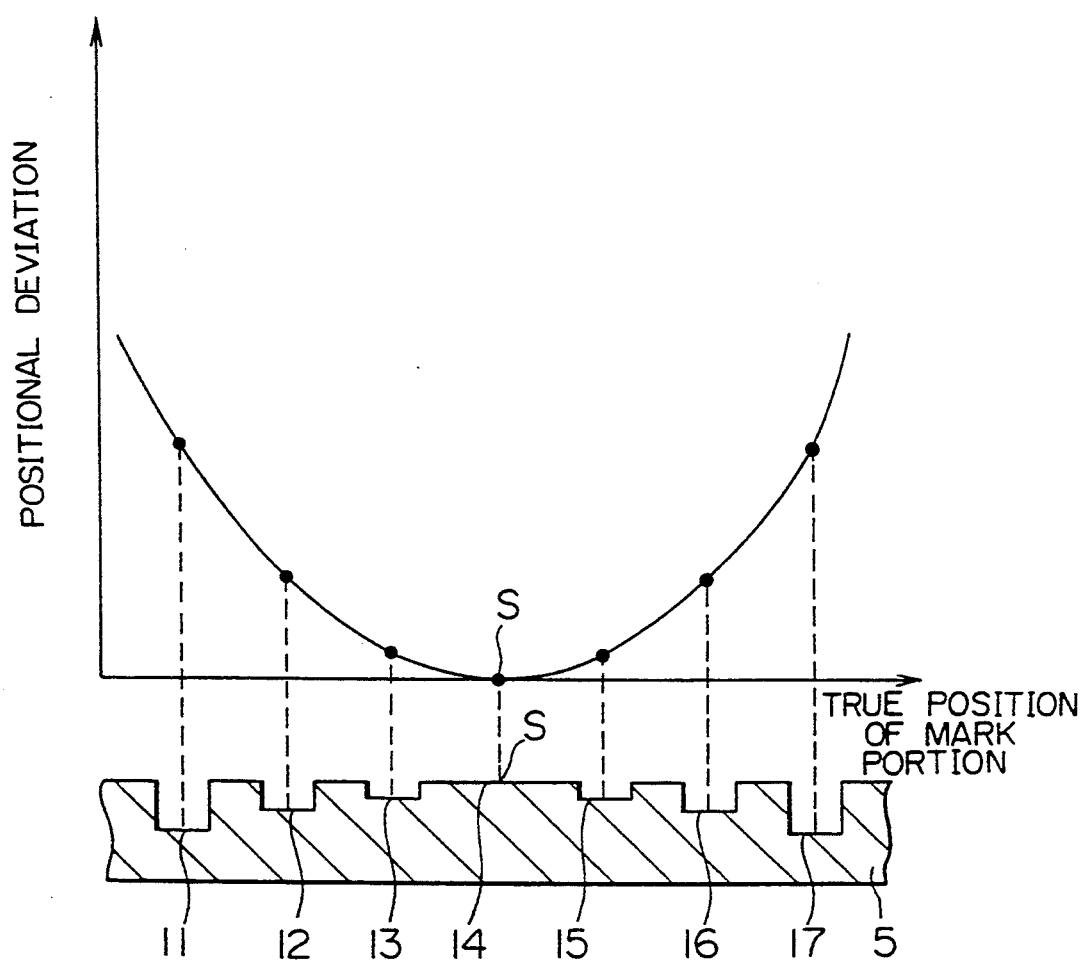
FIG. 4 illustrates the principle of the aligning method according to the present invention.

Hence, the mark portions are plotted on a graph, as shown in FIG. 4, in which the abscissa represents the true position of each of the mark portions and the ordinate axis represents the apparent positional deviation in each of the first through third mark portions 11 through 13 and the fifth through seventh mark portions 15 through 17. The position of the fourth mark portion 14 having zero positional deviation can be interpolated by a polynomial approximation using the graph.

A practically employed method of aligning the substrate 5 with the metal film 6 thereon will be described below. First, a laser beam illuminates on the surface 5a of the substrate 5 perpendicular thereto. This laser beam is scanned along the surface 5a of the substrate. When the laser beam overlaps the first through third mark portions 11 through 13 and the fifth through seventh mark portions 15 through 17 of the alignment mark, diffracted light is generated, decreasing the intensity of light reflected by the surface 5a of the substrate 5 perpendicular thereto. It is thus possible to detect the apparent position of the mark portions 11 through 13 and 15 through 17 by monitoring the intensity of light reflected by the substrate 5. The fourth mark portion 14 is level with the surface 5a, and detection of the position thereof by the laser beam is thus impossible.

Here, as shown in FIG. 3, the apparent positions of the first through third mark portions 11 through 13 and of the fifth through seventh mark portions 15 through 17 are respectively plotted, as points P1 through P3 and P5 through P7, on a graph in which the X axis is the apparent position of each of the mark portions and the Y axis is the level, i.e., the depth, of each of the mark portions. Next, the midpoint of a pair of points representing a pair of mark portions having the same level is obtained. Concretely, midpoint Q1 between the points P1 and P7, midpoint Q2 between the points P2 and P6 and midpoint Q3 between the points P3 and P5 are obtained. Point S having zero level is extrapolated by a polynomial approximation using these midpoints Q1, Q2 and Q3. Point S corresponds to the central point of the fourth mark portion 14 where no apparent positional deviation due to the metal film 6 occurs. This point S is used as a reference point for alignment.

After the reference point S of the substrate 5 is calculated, alignment of the substrate 5 is performed using the reference point S as a reference.

Figure 5:
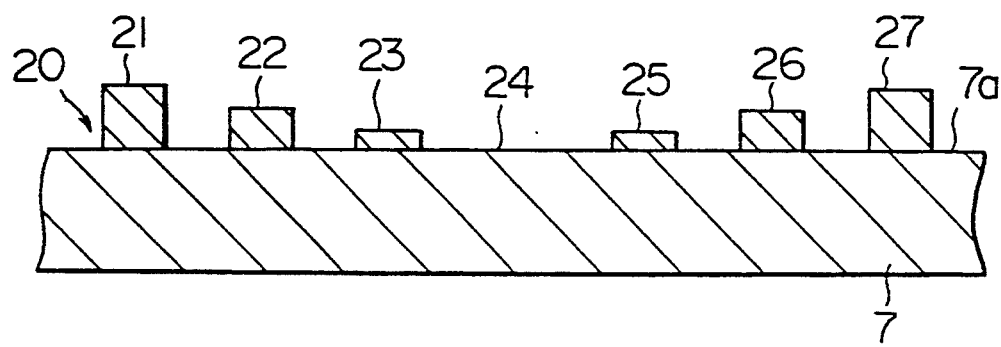
FIG. 5 is a cross-sectional view of a second embodiment of the alignment mark according to the present invention.

On the surface of the substrate with projecting portions formed thereon, an apparent positional deviation due to the formation of a film occurs, as in the case of the surface with the recessed portion formed therein. In that case, an alignment mark 20 such as that shown in FIG. 5 is employed. The alignment mark 20 has first through seventh mark portions 21 through 27 on the surface of a substrate 7 at a predetermined pitch. The first through third mark portions 21 through 23 are projecting portions having different levels, i.e., heights, from a surface 7a of the substrate 7. The fourth mark portion 24 has the same level as the surface 7a of the substrate. The fifth, sixth and seventh mark portions 25, 26 and 27 are projections having the same levels as the third, second and first mark portions 23, 22 and 21, respectively. Alignment of the substrate 7 is performed using the alignment mark 20 in the same manner as that of the aforementioned embodiment.

Figure 6:
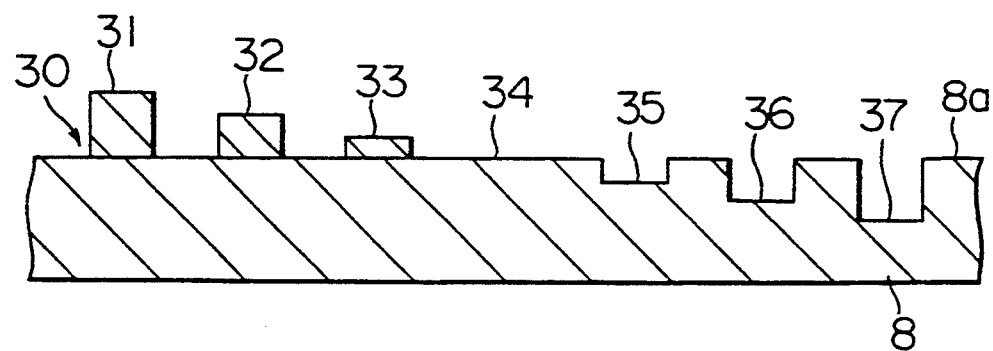
FIG. 6 is a cross-sectional view of a third embodiment of the alignment mark according to the present invention.
Figure 7:
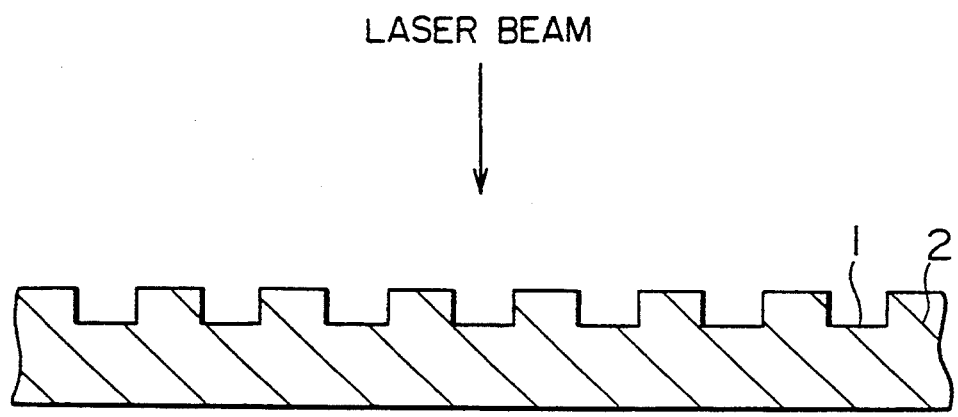
FIG. 7 is a cross-sectional view of a conventional alignment mark.
Figure 8:
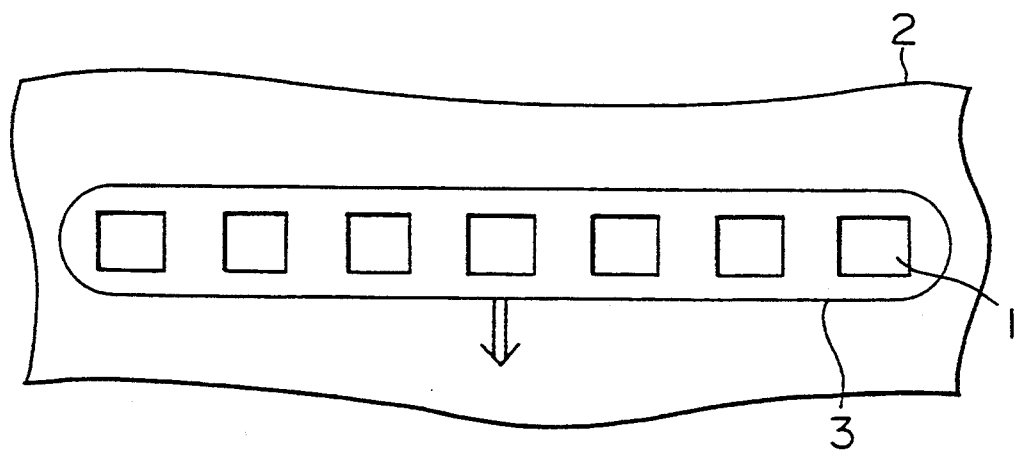
FIG. 8 is a plan view of the alignment mark of FIG. 7.

Alternatively, an alignment mark 30 having a combination of recesses and projecting portions, shown in FIG. 6, may be used. First through third mark portions 31 through 33 are projecting portions having different heights from a surface 8a of a substrate 8. Fifth through seventh mark portions 35 through 37 are recesses having depths which are the same as the heights of the third through first mark portions 33 through 31. A fourth mark portion 34 has the same level as the surface 8a of the substrate 8. The alignment mark 30 has the same effect as the alignment mark 10 shown in FIG. 1 or the alignment mark 20 shown in FIG. 5.

Each of the alignment marks 10, 20 and 30 can be formed by repeating a lithographic process a plurality of times. It may also be formed by FIB (focused ion beam etching).

What is claimed is:

1. An alignment mark on a substrate for aligning the substrate comprising a substrate having a surface, a central reference mark portion having a surface at the surface of the substrate, and a plurality of pairs of spaced apart mark portions on the substrate, the mark portions of each mark portion pair being diposed on opposite sides of the central reference mark portion, each mark portion pair having a respective, different level relative to the surface of the substrate.

2. The alignment mark according to claim 1 wherein each of the mark portions of the plurality of mark portion pairs comprises a recess in the substrate.

3. The alignment mark according to claim 1 wherein each of the mark portions of the plurality of mark portion pairs comprises a projection projecting from the surface of the substrate.

4. The alignment mark according to claim 1 wherein the central reference mark portion and the plurality of mark portion pairs are disposed along a straight line at a fixed pitch.

5. The alignment mark according to claim 1 wherein each of the mark portion pairs includes mark portions located at respective positions symmetrical with respect to the central reference mark portion.

6. The alignment mark according to claim 1 wherein each of the plurality of mark portion pairs includes one recess and one projection, the recess of a mark portion pair having a depth relative to the surface of the substrate that is the same as a height of the projection of that mark portion pair relative to the surface of the substrate.

7. A method of aligning a substrate when a pattern on a mask is to be transferred onto the substrate comprising:

forming an alignment mark on a surface of a substrate, said alignment mark including a central reference mark portion having a surface at the surface of the substrate and a plurality of pairs of spaced apart mark portions on the substrate, the mark portions of each mark portion pair being disposed on opposite sides of the central reference mark portion, each mark portion pair having a respective, different level relative to the surface of the substrate;

illuminating the surface of the substrate with light;

detecting the apparent positions of each of the mark portions of the pairs of mark portions from the light reflected from the substrate;

determining an apparent center position between the apparent positions of each of the plurality of pairs of mark portions;

calculating the position of the central reference mark portion by one of interpolation and extrapolation from the apparent center positions of each of the mark portion pairs; and aligning the substrate in response to the calculated position of the central reference mark portion.

* * * * *